(12) United States Patent
Chen et al.

(10) Patent No.: US 8,723,559 B2
(45) Date of Patent: May 13, 2014

(54) DYNAMIC DRIVER CIRCUIT (75) Inventors: Chang-Ting Chen, Hsinchu (TW);
Chin-Hung Chang, Tainan (TW);
Shang-Chi Yang, Changhua (TW);
Kuan-Ming Lu, Kaohsiung (TW);
Ken-Hui Chen, Hsinchu (TW);
Kuen-Long Chang, Taipei (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/603,815

(22) Filed: Sep. 5, 2012

(65) Prior Publication Data

US 2014/0062543 A1  Mar. 6, 2014

(51) Int. Cl.
*H03B 1/00* (2006.01)
*H03K 3/00* (2006.01)

(52) U.S. Cl.
USPC ....... 327/108; 327/109; 327/261; 365/230.06

(58) Field of Classification Search
USPC ............... 327/108, 109, 261; 365/230.06
See application file for complete search history.

(56) References Cited

U.S. PATENT DOCUMENTS

2013/0148458 A1* 6/2013 Park .................... 365/230.06

* cited by examiner

*Primary Examiner* — John Poos
(74) *Attorney, Agent, or Firm* — Yiding Wu; Haynes Beffel & Wolfeld LLP (57) ABSTRACT A circuit usable as a word line driver includes a driver that switches in response to a voltage on a control node, and a circuit supplying a voltage to the control node. The circuit that applies a voltage to control node provides a first static current tending to pull the control node up to a first source voltage, and provides a fighting current pulse in response to a signal selecting the driver to pull the control node down to a second source voltage, overcoming the first static current. In addition, a circuit provides a pull-up boost current on a transition of the signal selecting the driver that turns off the fighting current, and applies a boosting current pulse to the control node to assist pulling the control node quickly to the first source voltage.

18 Claims, 5 Drawing Sheets

DYNAMIC DRIVER CIRCUIT

BACKGROUND

1. Field of the Invention

The technology relates to integrated circuits that include drivers for large loads, and in particular to word line drivers for low voltage memory devices.

2. Description of Related Art

Memory integrated circuits access memory cells with word lines powered by word line drivers, capable of driving various voltages at high speed on a large capacitive load. Word line drivers drive associated word lines with various voltage levels that depend on the mode of operation of the memory, where modes for a flash memory can include read, program, and erase operational modes. The voltages used for the various operating modes are often larger than the power supply voltages used for low voltage devices. For example, a word line voltage for a read operation in a flash memory may be about 5 volts, while the supply voltage for the device may be 1.8 volts.

The read mode for many memory devices is often speed critical. However, low voltages that depend on the supply voltage used by the peripheral circuits, including word line decoders and driver selection circuits, can limit the speed of switching for the word line drivers.

SUMMARY

Driver circuitry is described which can be used in low voltage, high speed circuit environments for driving high capacitive loads. The driver can include a dynamic selection circuit that sets a control node of the driver. The dynamic selection circuit includes a pull-up circuit and a pull-down circuit responsive to decoded control signals, along with a pull-up boost circuit. The pull-up boost circuit is controlled to boost current flow upon a transition of the voltage at the control node. The driver is suitable for use as a word line driver in low supply voltage integrated circuit memory devices. The driver can improve switching characteristics without a significant cost in increased circuit complexity.

A circuit usable as a word line driver that is described herein, includes a driver that switches in response to a voltage on a control node, and a circuit supplying a voltage to the control node. The circuit that supplies a voltage to a control node provides a first static current tending to pull the control node up to a first source voltage, and provides a fighting current pulse in response to a signal selecting the driver to pull the control node down to a second source voltage, overcoming the first static current. In addition, a circuit provides a pull-up boost current on a transition of the signal selecting the driver that turns off the fighting current, and applies a boosting current pulse to the control node to assist pulling the control node quickly to the first source voltage. This boosting current pulse can be applied without requiring feedback from the load.

Other aspects and advantages of the present technology can be understood by review of the drawings and the detailed description which follow.

DETAILED DESCRIPTION

Figure 1:
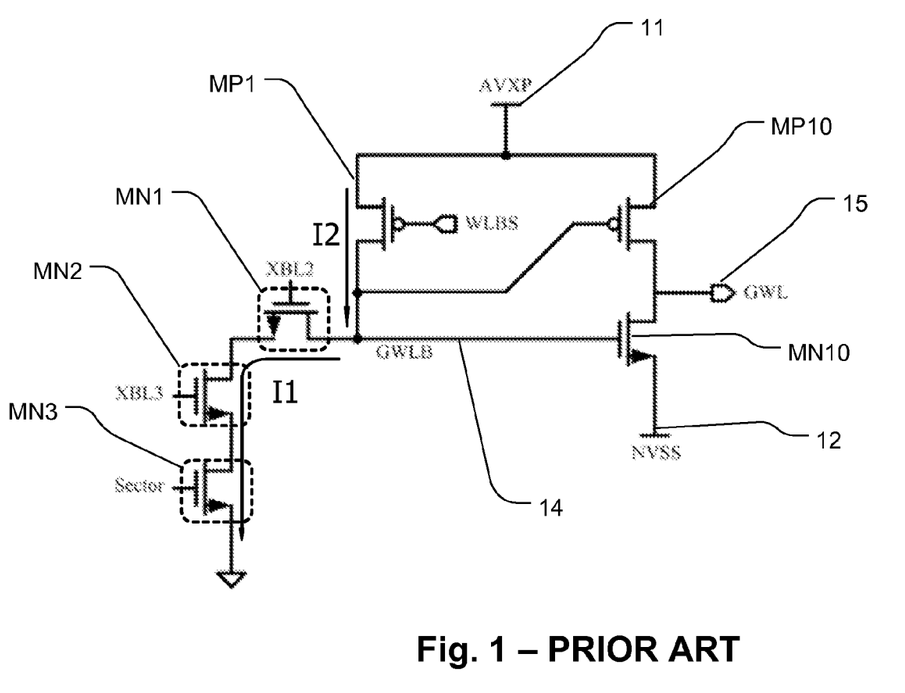
FIG. 1 is a schematic diagram of a prior art driver circuit usable to drive high capacitive loads, like word lines on integrated circuits.

FIG. 1 shows a circuit diagram of word line driver and driver selection circuit which can be used in a low voltage integrated circuit, to drive a high voltage on a high capacitive load.

In this example, the driver includes p-channel transistor MP10 having a source connected to a first source voltage AVXP (from voltage source 11) and a drain connected to a load which comprises a global word line 15 for an integrated circuit memory. Also, an n-channel transistor MN10 has a drain connected to the global word line 15, and a source connected to a second source voltage NVSS (from voltage source 12). The source and drain can be referred to as current carrying terminals of the transistors. The gates of transistors MP10 and MN10 are connected together to a driver control node 14, at which the voltage GWLB occurs. Thus, the transistors MP10 and MN10 are connected in the form of an inverting buffer, delivering a high voltage AVXP on the global word line 15 when the voltage GWLB is low, and delivering a low voltage NVSS on the global word line 15 when the voltage GWLB is high.

The first source voltage AVXP can be generated using biasing and supply voltage circuitry that includes a charge pump or other voltage sources on the integrated circuit. The first source voltage AVXP can vary depending on the operating mode of the device, and in some modes can be significantly higher than the supply voltage applied to the chip. The second source voltage NVSS can also be generated using biasing and supply voltage circuitry that includes a charge pump or other voltage sources on the integrated circuit. The second source voltage NVSS can vary depending on the operating mode of the device, and in some modes can be negative. In some modes NVSS is ground potential.

A global word line 15 can be coupled to a set of local word line drivers, which couple the global word line to the local word lines in response to decoded signals. The capacitive load of a global word line 15 can therefore be quite large.

Driver select circuitry is connected to the control node 14, and responds to decoded address signals to control the voltage GWLB. In this example, the driver select circuitry includes a pull-up circuit that comprises p-channel transistor MP1, which has its gate coupled to a constant bias voltage WLBS tending to keep it in a relatively weak conducting state, applying a static current. The constant bias voltage WLBS can be preferred over feedback from the output of the driver, in circuitry where the driver has a large capacitive load, because the large capacitive load will slow down operation of the device.

Also, the driver select circuitry includes a pull-down circuit that comprises re-channel transistors MN1, MN2 and MN3 in series between the control node 14 and ground (or NVSS). The gates of the transistors MN1, MN2 and MN3 are connected to decoded address signals XBL2, XBL3 and Sector, respectively, in this example.

In the circuitry shown FIG. 1, the pull-up circuit delivers a current I2 from the first supply voltage to the control node 14, and the pull-down circuit delivers a current I1 from the node 14 to ground. One limit on the design of the pull-up and pull-down circuitry arises in the low voltage configurations, where the n-channel transistors MN0, MN1 and MN2 can suffer serious body effect with a small overdrive voltage over the series of transistors. In this situation, the current I1 will be relatively small.

Also, the circuitry must be configured so that the current I1 is significantly greater than the current I2, so that when the control node 14 is selected, and transitions from a high voltage to a low voltage, the current I1 can quickly overcome the current I2 and pull the node 14 down. On the other hand, the circuitry must also be configured so that the current I2 is large enough that when the control node 14 is deselected, the voltage on the node 14 transitions from low voltage to high voltage relatively quickly.

This configuration presents a difficult design trade-off, particularly in environments requiring high-speed operation. One way to address the speed of switching, is to add buffers on the global word line 15, allowing the sizes of the transistors MP10 and MN10 to be reduced. This reduces the capacitance of the node 14. However, this design approach comes at the cost of increased area and circuit complexity on the device.

Figure 2:
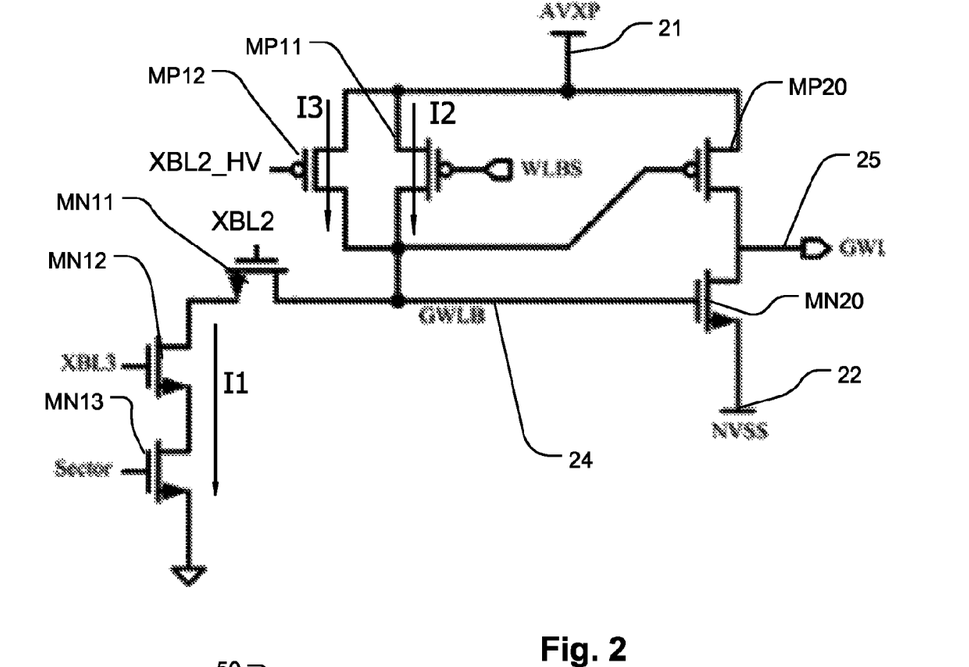
FIG. 2 is a schematic diagram of a driver circuit including a pull-up boost circuit, usable to drive high capacitive loads like word lines on integrated circuits.

FIG. 2 illustrates an improved word line driver, which is modified by the addition of a pull-up boost circuit implemented for example by the p-channel transistor MP12.

In this example, the driver includes p-channel transistor MP20 having a source connected to a first source voltage AVXP (from voltage source 21) and a drain connected to a load which comprises a global word line 25 for an integrated circuit memory. Also, an n-channel transistor MN20 has a drain connected to the global word line 25, and a source connected to a second source voltage NVSS (from voltage source 22). The gates of transistors MP20 and MN20 are connected together to a driver control node 24, at which the voltage GWLB occurs. Thus, the transistors MP20 and MN20 are connected in the form of an inverting buffer, delivering a high voltage AVXP on the global word line 25 when the voltage GWLB is low, and delivering a low voltage NVSS on the global word line 25 when the voltage GWLB is high.

The first source voltage AVXP can be generated using biasing and supply voltage circuitry that includes a charge pump or other voltage sources on the integrated circuit. The second source voltage NVSS can also be generated using biasing and supply voltage circuitry that includes a charge pump or other voltage sources on the integrated circuit. The first and second voltage sources can have limited driving power, as they can require charge pumps or other specialized circuits on the integrated circuit that must produce the high voltage using a low supply voltage. A "supply voltage" for the purposes of this description refers to a voltage applied to an integrated circuit from an external source, and used primarily to power the integrated circuit. A voltage source or a source voltage on the other hand can include circuits used to provide operating voltages at selected levels such as AVXP and NVSS, including at the level of the supply voltage.

Driver select circuitry is connected to the control node 24, and responds with decoded address signals to control the voltage GWLB. In this example, the driver select circuitry includes a pull-up circuit that comprises p-channel transistor MP11, which has its gate coupled to a constant bias voltage WLBS tending to keep it in a relatively weak conducting state. The bias voltage WLBS is independent of the voltage at the load, that is it is generated without feedback of the voltage on the load. In other embodiments, the pull-up circuit can comprise one or more transistors or other circuit elements that can provide a small pull-up current that tends to hold the control node 24 at a high level, and which can be overcome by the fighting current from a pull-down circuit.

Also the driver select circuitry includes a pull-down circuit that comprises re-channel transistors MN11, MN12 and MN13 in series between the control node 24 and ground (or NVSS). The gates of the transistors MN11, MN12 and MN13 are connected to decoded address signals XBL2, XBL3 and Sector, respectively in this example. The decoded address signals XBL2, XBL3 and Sector switch between a driver select level, at or lower than the first supply voltage, and a driver deselect level. For example, the driver select level can be about VDD, which for a low voltage integrated circuit can be 1.8 V for example. A driver deselect level can be about ground. In other embodiments, the pull-down circuit can comprise one or more transistors in series having decoded signals on their gates.

Figure 3:
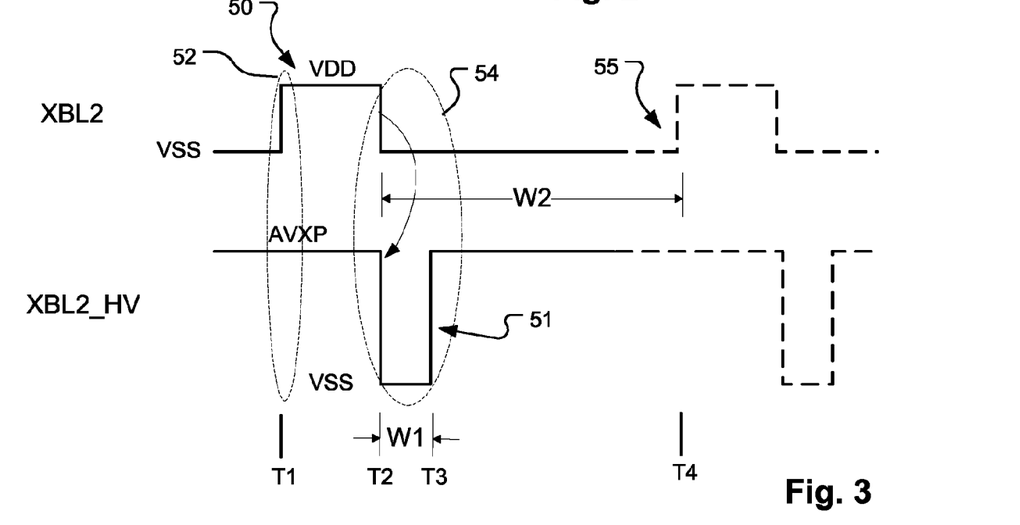
FIG. 3 is a timing diagram illustrating operation decoded control signals used by the circuit of FIG. 2.

The pull-up boost circuit in this example comprises p-channel transistor MP12, which has its source coupled to the first supply voltage AVXP and its drain coupled to the control node 24 for the driver. The gate of transistor MP12 is connected to a high voltage decoded signal XBL2_HV, which can be generated based upon the low voltage decoded signal XBL2 as shown in FIG. 3. In other embodiments, the pull-up boost circuit can comprise other circuit elements, such as a current mirror circuit, or a circuit including a plurality of transistors in series.

In operation, the global word line 25 is normally deselected, meaning that the voltage GWBL on node 24 is high. This voltage is maintained by the pull-up circuit comprising p-channel transistor MP11 as explained above with reference to the transistor MP1 of FIG. 1. In the deselected state, the decoded signal XBL2 is low, turning off transistor MN11. Likewise, the decoded signals XBL3 and Sector will be low, turning off transistors MN12 and MN13.

When XBL2 is low (e.g. at VSS) as shown in FIG. 3, the signal XBL2_HV will be higher than a level that is less than the threshold voltage below AVXP (e.g. at AVXP) so that transistor MP12 will remain off. Only a relatively low current I2 is provided by the pull-up circuit through transistor MP11 to hold the node 24 high.

When the driver changes to a selected state, such as at the time T1 shown in FIG. 3, the decoded signals Sector, XBL3 and XBL2 transition to their high level at VDD for example. For the purposes of this example, the timing critical signal is XBL2 which is used to apply a pulse 50 to the gate of transistor MN11 as shown in FIG. 3. As illustrated in region 52 of FIG. 3, at time T1, the signal XBL3_HV remains high (e.g., AVXP). This causes the current I1 to pull-down the node 24, a overcoming the current I2 through the pull-up circuit, while the transistor MP12 remains off.

The driver remains selected for an interval of time shown in FIG. 3, from T1 to T2. At time T2, as shown in region 54 of FIG. 2, the decoded signal XBL2 transitions to its low-level at VSS or ground for example. This turns off transistor MN11, blocking current I2. As transistor MN11 turns off at time T2, a pulse 51 in the signal XBL2_HV is applied, including a transition to its low-level at VSS or ground for example. This causes the transistor MP12 to turn on providing a boost current to the node 24 pulling up the voltage GWLB very quickly. At time T3, the signal XBL2_HV transitions to its high level. This causes the transistor MP12 to turn off after the interval of time having a duration W1 between times T2 and the T3. This interval is preferably very short, just long enough to temporarily boost to the pull-up power and cause fast switching of the driver as GWLB goes above the transition voltage for the buffer.

The duration W1 of the interval during which the boost current is applied, is preferably much shorter than the minimum time interval W2 between the falling edge of the pulse 50, and the rising edge of a subsequent pulse 55 at time T4 in the example shown. The signal traces are changed to dashed lines in FIG. 3 after the first pulses, to illustrate that the subsequent pulse 55 may or may not occur at the end of the minimum time interval W2.

Figure 4:
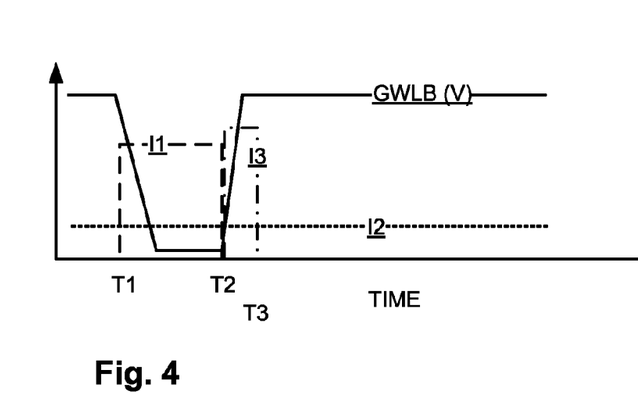
FIG. 4 is a timing diagram illustrating voltage and current levels in the circuit of FIG. 2.

FIG. 4 is a heuristic diagram (not to scale) showing the current levels for I1, I2 and I3 along with a voltage level GWLB at node 24 in the circuit of FIG. 2. As can be seen, the current I2 can be thought of as remaining essentially constant and relatively low during operation of the driver, although it may actually fluctuate somewhat. The current I1 is off until the time T1 when it increases rapidly, and then turns off again at the time T2. This relatively high current I1 pulls down the voltage GWLB very quickly. The current I3 is off until the time T2, when it increases rapidly, and then turns off again at time T3. Thus, the current I3 boosts the voltage GWLB quickly before it turns off at time T3. The current I2 maintains the voltage GWLB high until the driver is selected again.

Figure 5A:
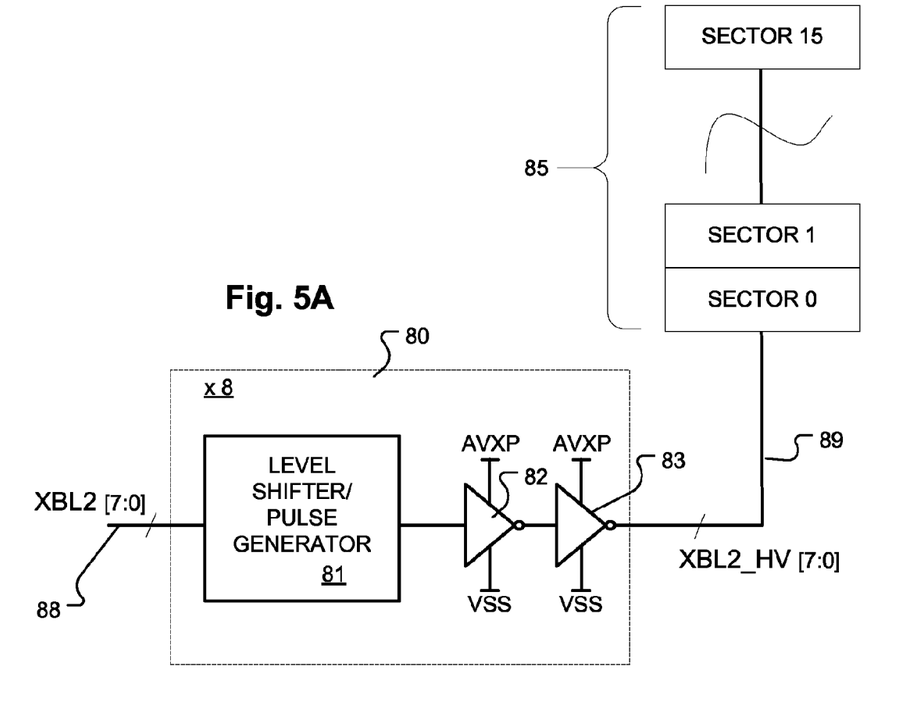
FIGS. 5A-5C illustrate circuitry which can be used to produce decoded control signals shown in FIG. 3.

FIG. 5A is a simplified diagram of circuitry that can be used to produce the signal XBL2_HV for use in global word line drivers for an integrated circuit memory 85 that includes a plurality of sectors. In this example, eight instances of XBL2, labeled XBL2[7:0], are produced by the decoding circuitry. XBL2[7:0] are distributed via bus 88 to respective pulse generators 80, each of which puts out a corresponding version of the signal XBL2_HV[7:0] on bus 89. The signals on bus 89 are delivered to the memory 85 where it is used to control the global word line drivers in the sectors of the memory.

The pulse generators 80 include a level shifter/pulse generator circuit 81 which translates the low voltage input XBL2 to a high voltage signal that is normally high, with an inverted pulse upon a falling edge of the signal XBL2. The output of the level shifter/pulse generator circuit 81 is applied to buffers 82 and 83 in series to provide driving power for the output bus 89.

Figure 5B:
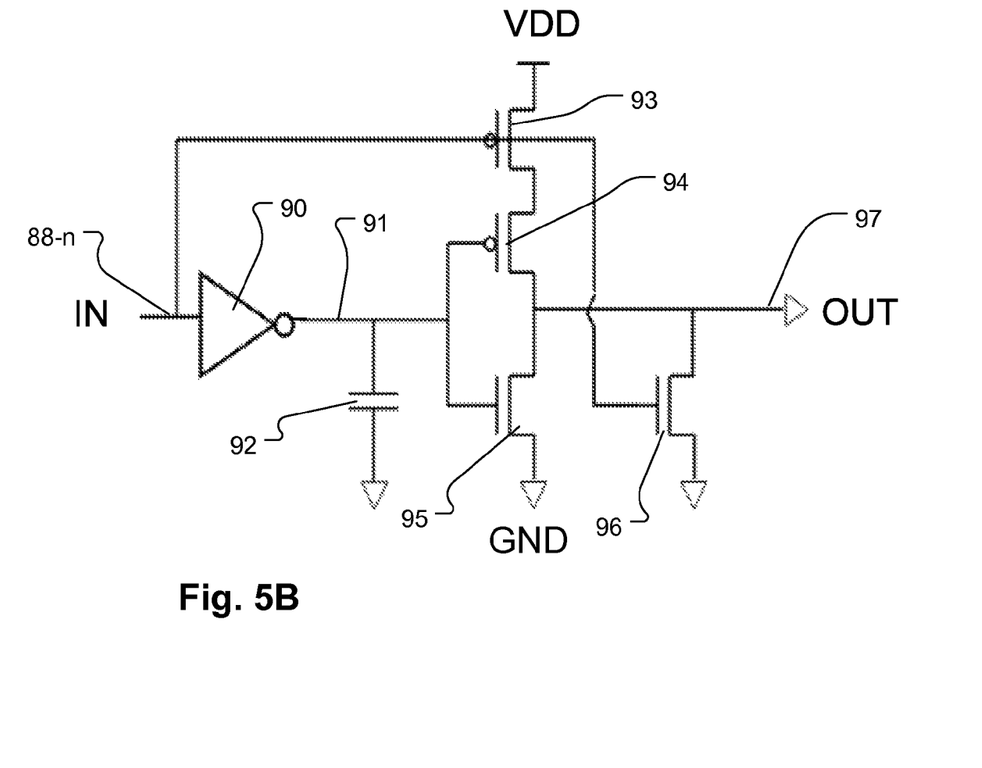

FIG. 5B is a schematic of a circuit that can be used in the levels shifter/pulse generator 81 of FIG. 5A, to produce a pulse on the falling edge of XBL2. The circuit receives one of the XBL2 signals as the signal IN on line 88-*n*. Line 88-*n* is connected to the input of the inverter 90, which drives node 91. A capacitor 92 is connected between node 91 and ground. Circuit also includes p-channel transistor 93, p-channel transistor 94, and n-channel transistor 95 in series between the supply voltage VDD and ground. The gate of p-channel transistor 93 is connected to the signal IN on line 88-*in*. The gates of p-channel transistor 94 and n-channel transistor 95 are connected to node 91. The drain of p-channel transistor 94 and the drain of n-channel transistor 95 are coupled in common to the output node 97. Also, n-channel transistor 96 is connected between the output node 97 and ground. The gate of n-channel transistor 96 is connected to the signal IN on line 88-*n*.

Figure 5C:
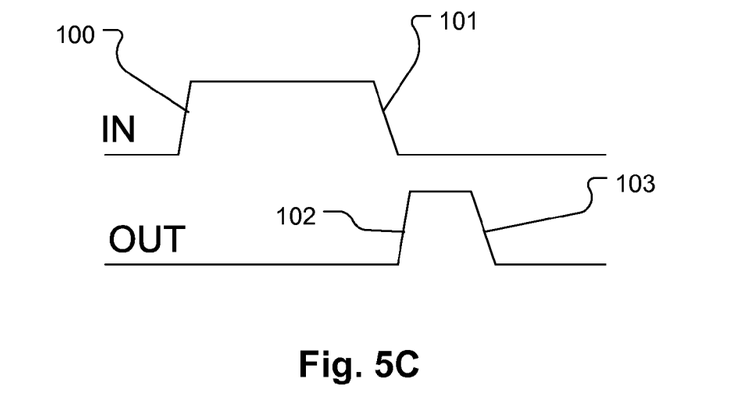

FIG. 5C is a timing diagram referred to for the purposes of describing the operation of the circuit FIG. 5B. In operation, when the signal IN on line 88-*n* is low, node 91 is high, transistor 93 is on and transistor 96 is off. Also, transistor 94 is off and transistor 95 on. Transistor 95 holds the output node 97 low. When the signal IN transitions at time 100 to high-value, transistor 93 is turned off while node 91 is driven low after a certain delay caused by the capacitor 92. Because IN is high, transistor 96 turns on and holds the output node 97 low.

At time 101, when the signal IN transitions to the low value, transistor 93 turns on, and transistor 96 turns off. Node 91 remains low for a certain delay caused by the capacitor 92. During this delay, the output node 97 is pulled high at transition 102 very shortly after the transition 101. After node 91 rises above the threshold of p-channel transistor 94, and above the threshold of n-channel transistor 95, the pull-up current through transistor 94 turns off, and transistor 95 pulls the output node 97 low at transition 103. Thus, the circuit produces a short pulse between transitions 102 and 103 shortly after the falling edge 101 of the signal IN. This pulse OUT on node 97 can be inverted, and level shifted to produce the XBL2_HV signal.

The driver shown in FIG. 2, and other embodiments of the circuit, can be deployed for high-speed memory devices. The dynamic discharge scheme accomplished by the pull-up boost circuit in the drivers can significantly improve the speed of operation of the drivers, and allow higher read speeds, and other higher speed operations on the device. The circuit can be particularly useful in low voltage integrated circuits, where the supply voltage applied to the integrated circuit can be on the order of 1.8 V or less.

The driver can be deployed at other locations in the decoding path of a memory device, besides the global word line driver. Likewise, this driver can be deployed in any circuit where high speed operation, in response to dynamically switching control signals like decoded addresses, requires driving a high capacitive load.

Figure 6:
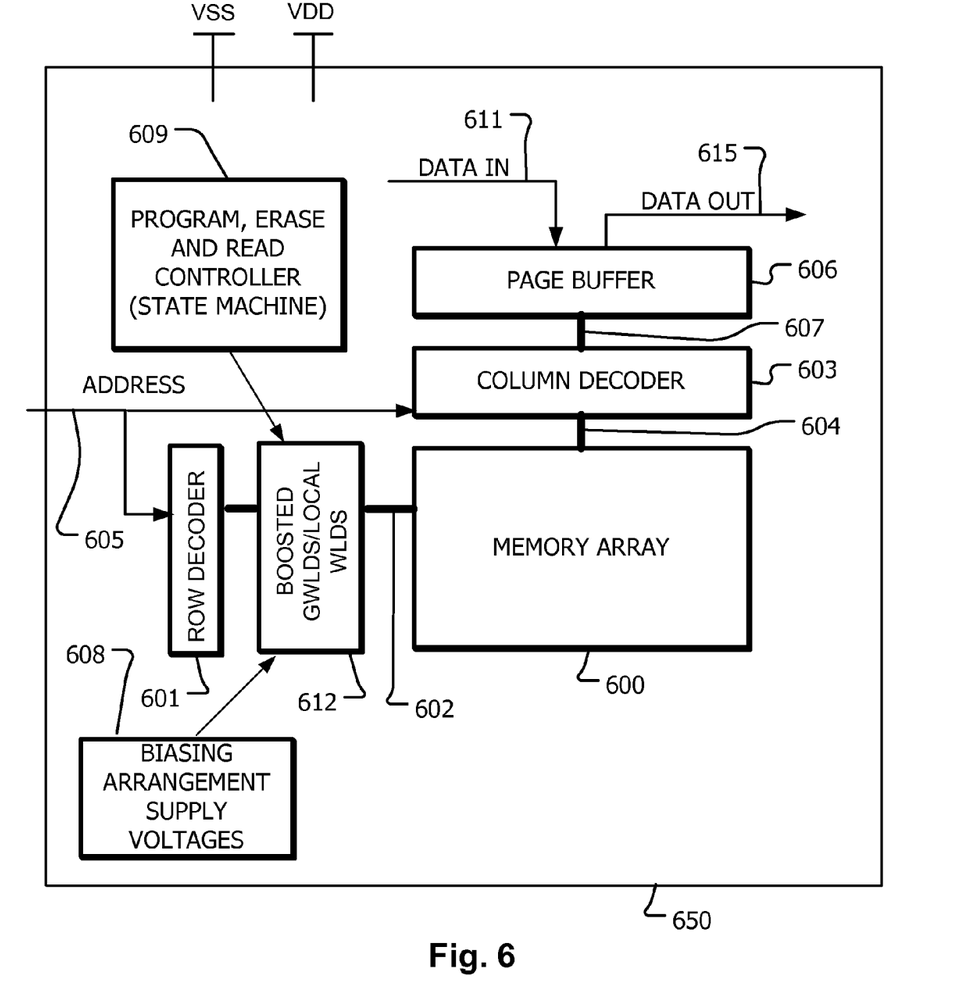
FIG. 6 is a simplified block diagram of an integrated circuit including word line driver circuits like that of FIG. 2.

FIG. 6 is a simplified block diagram of an integrated circuit 650 including a memory array 600 implemented using boosted global word line drivers as described herein. A row decoder 601 is coupled to, and in electrical communication with, boosted global word line drivers and local word line drivers in block 612, which drive word lines 602 arranged along rows in the memory array 600. A column decoder 603 is coupled to and in electrical communication with a plurality of bit lines 604 arranged along columns in the memory array 600 for reading data from, and writing data to, the memory cells in the memory array 600. The column decoder 603 is coupled to a page buffer 606 by data lines in bus 607, which includes sense amplifiers, and other circuitry. Addresses are supplied on bus 605 to the row decoder 601 and to the column decoder 603. Data is supplied via the data-in line 611 from input/output ports on the integrated circuit 650, to the page buffers 606. Data is supplied via the data-out line 615 from the page buffers 606 to input/output ports on the integrated circuit 650, or to other data destinations internal or external to the integrated circuit 650. A state machine, clock circuitry and other control logic are in circuitry 609. Biasing arrangement supply voltages are generated in block 608, using charge pumps and other voltage sources, and are supplied to the boosted global word line driver and local word line drivers in block 612, and to other circuitry on the integrated circuit. The integrated circuit 650 includes terminals used to connect to a power supply, which provides the supply voltage VDD and VSS to the chip. In embodiments described herein, the supply voltage VDD can be a low voltage, such as about 1.8 Volts.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit configured to operate with a supply voltage, comprising:
   a driver having an input connected to a control node, and an output connected to a load, which couples the load to a first source voltage or a second source voltage in response to a voltage on the control node, wherein the first source voltage is higher than the supply voltage;
   a pull-up circuit connected between the control node and the first source voltage;
   a pull-down circuit connected between the control node and the second source voltage; and
   a pull-up boost circuit connected between the control node and the first source voltage to provide a second current into the control node in addition to a first current provided by the pull-up circuit into the control node.

2. A circuit configured to operate with a supply voltage, comprising:
   a driver having an input connected to a control node, and an output connected to a load, which couples the load to a first source voltage or a second source voltage in response to a voltage on the control node, wherein the first source voltage is higher than the supply voltage;
   a pull-up circuit connected between the control node and the first source voltage;
   a pull-down circuit connected between the control node and the second source voltage; and
   a pull-up boost circuit connected between the control node and the first source voltage to boost current flow between the first source voltage and the control node,
   the pull-down circuit being responsive to a driver select signal having a select voltage level at or lower than the supply voltage and a de-select voltage level, wherein the pull-up boost circuit is normally off, and boosts said current flow for a boosting interval of time starting on or after a transition of the driver select signal from the select level to the de-select level.

3. The circuit of claim 2, wherein the boosting interval ends before a next transition of the driver select signal from the de-select level to the select level.

4. The circuit of claim 1, wherein the driver comprises a p-channel transistor in series with an n-channel transistor with a node in between connected to the load, and having their gates connected to the control node.

5. The circuit of claim 1, wherein the pull-up boost circuit comprises a p-channel transistor connected between the control node and the first source voltage, having a gate connected to a boost control signal, and including a circuit to generate the boost control signal normally at a voltage level high enough to turn off the p-channel transistor, with transitions to a lower voltage level to turn on the p-channel transistor for a boosting interval.

6. The circuit of claim 5, wherein the boosting interval starts on or after a transition of the driver select signal from a select level to a de-select level, and the select level of the driver select signal is at or lower than the first supply voltage, and the voltage level of the boost control signal is a level high enough to turn off the p-channel transistor.

7. The circuit of claim 1, the pull-down circuit being responsive to a driver select signal having a select voltage level and a de-select voltage level, and wherein the pull-down circuit comprises a series of n-channel transistors between the control node and the second source voltage, one of the n-channel transistors in the series having a gate connected to the driver select signal, and the select level of the driver select signal is lower than the first source voltage.

8. The circuit of claim 1, wherein the pull-up circuit is a controlled by a bias voltage that is independent of the voltage at the load.

9. The circuit of claim 1, wherein the pull-up circuit comprises a p-channel transistor connected between the control node and the first source voltage, having a gate connected to a static bias voltage.

10. A circuit configured to operate with a supply voltage, comprising:
    a driver having an input connected to a control node, and an output connected to a load, which couples the load to a first source voltage or a second source voltage in response to a voltage on the control node, wherein the first source voltage is higher than the supply voltage;
    a pull-up circuit connected between the control node and the first source voltage;
    a pull-down circuit connected between the control node and the second source voltage; and
    a pull-up boost circuit connected between the control node and the first source voltage to boost current flow between the first source voltage and the control node,
    the pull-down circuit being responsive to a driver select signal having a select voltage level and a de-select voltage level, and wherein the pull-up circuit is statically biased to a conducting state, and the pull-down circuit overcomes the pull-up circuit when the driver select signal is at the driver select level.

11. The circuit of claim 1, wherein said load comprises a word line in a memory array, and including an address decoder which generates the driver select signal.

12. A circuit configured to operate with a supply voltage, comprising:
    a driver including a p-channel transistor having a source terminal connected to a source of a first source voltage, a drain connected to a load terminal, and a gate coupled to a control node, and an n-channel transistor having a source terminal connected to a source of a second source voltage, a drain connected to a load terminal, and a gate coupled to the control node, wherein the first source voltage is higher than the supply voltage;
    a driver select circuit including a first p-channel transistor connected between the control node and the first source voltage, having a gate connected to a static bias voltage, one or more n-channel transistors between the control node and the second source voltage, said one of the one or more n-channel transistors having a gate connected to a driver select signal having a select voltage level at or lower than the supply voltage, and a de-select voltage level, and a p-channel transistor connected between the control node and the first source voltage, having a gate connected to a boost control signal; and
    a circuit to generate the boost control signal normally at a higher voltage level to turn off the second p-channel transistor, with transitions to a lower voltage level to turn on the p-channel transistor for a boosting interval of time starting on or after a transition of the driver select signal from the select level to the de-select level.

13. The circuit of claim 12, wherein the boosting interval ends before a next transition of the driver select signal from the de-select level to the select level.

14. The circuit of claim 12, wherein said load comprises a word line in a memory array, and including an address decoder which generates the driver select signal.

15. An operating method for a circuit driving a high capacitive load, where the circuit switches in response to a voltage on a control node, comprising:

providing a static first current tending to pull the control node to a first source voltage;

in response to a first transition of a signal selecting the driver, providing a fighting current pulse to pull the control node to a second source voltage by overcoming the static first current; and in response to a second transition of the signal selecting the driver, turning off the fighting current pulse, and applying a boosting current pulse to the control node to assist pulling the control node to the first source voltage.

16. An operating method for a circuit driving a high capacitive load, where the circuit switches in response to a voltage on a control node, comprising:

providing a static first current tending to pull the control node to a first source voltage;

in response to a first transition of a signal selecting the driver, providing a fighting current pulse to pull the control node to a second source voltage by overcoming the static first current; and in response to a second transition of the signal selecting the driver, turning off the fighting current pulse, and applying a boosting current pulse to the control node to assist pulling the control node to the first source voltage, wherein the boosting current pulse has a duration less than the minimum period between the second transition of the signal selecting the driver and a following first transition of the signal selecting the driver.

17. The method of claim 15, wherein the first source voltage is greater than a supply voltage used to generate the signal selecting the driver.

18. The method of claim 15, including generating a signal selecting the driver by decoding an address.

* * * * *